[19] United States Patent
Morin et al.

[10] Patent No.: US 10,032,912 B2
[45] Date of Patent: Jul. 24, 2018

(54) SEMICONDUCTOR INTEGRATED STRUCTURE HAVING AN EPITAXIAL SIGE LAYER EXTENDING FROM SILICON-CONTAINING REGIONS FORMED BETWEEN SEGMENTS OF OXIDE REGIONS

(71) Applicants: STMICROELECTRONICS, INC., Coppell, TX (US); GLOBALFOUNDRIES INC., Grand Cayman (KY); INTERNATIONAL BUSINESS MACHINES CORPORATION, Armonk, NY (US)

(72) Inventors: Pierre Morin, Albany, NY (US); Kangguo Cheng, Schenectady, NY (US); Jody Fronheiser, Delmar, NY (US); Xiuyu Cai, Niskayuna, NY (US); Juntao Li, Cohoes, NY (US); Shogo Mochizuki, Clifton Park, NY (US); Ruilong Xie, Schenectady, NY (US); Hong He, Schenectady, NY (US); Nicolas Loubet, Guilderland, NY (US)

(73) Assignees: STMICROELECTRONICS, INC., Coppell, TX (US); GLOBALFOUNDRIES INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/588,221

(22) Filed: Dec. 31, 2014

(65) Prior Publication Data
US 2016/0190304 A1 Jun. 30, 2016

(51) Int. Cl.
*H01L 29/78* (2006.01)
*H01L 29/16* (2006.01)
(Continued)

(52) U.S. Cl.
CPC .... *H01L 29/785* (2013.01); *H01L 21/823807* (2013.01); *H01L 21/823821* (2013.01);
(Continued)

(58) Field of Classification Search
CPC ......... H01L 21/823821; H01L 27/0886; H01L 27/0924; H01L 29/66795; H01L 29/785; H01L 2924/13067
See application file for complete search history.

(56) References Cited

U.S. PATENT DOCUMENTS

| | | | |
|---|---|---|---|
| 8,759,874 B1 | 6/2014 | Loubet et al. | |
| 2007/0221956 A1* | 9/2007 | Inaba | H01L 21/823807 257/197 |

(Continued)

OTHER PUBLICATIONS

Zhang, J., "SOI FINFET Transistor With Strained Channel," U.S. Appl. No. 14/231,466, filed Mar. 31, 2014 (35 pgs.).
(Continued)

*Primary Examiner* — Anh Mai
(74) *Attorney, Agent, or Firm* — Seed Intellectual Property Law Group LLP

(57) ABSTRACT

A modified silicon substrate having a substantially defect-free strain relaxed buffer layer of SiGe is suitable for use as a foundation on which to construct a high performance CMOS FinFET device. The substantially defect-free SiGe strain-relaxed buffer layer can be formed by making cuts in, or segmenting, a strained epitaxial film, causing edges of the film segments to experience an elastic strain relaxation. When the segments are small enough, the overall film is relaxed so that the film is substantially without dislocation defects. Once the substantially defect-free strain-relaxed buffer layer is formed, strained channel layers can be grown epitaxially from the relaxed SRB layer. The strained channel layers are then patterned to create fins for a FinFET device. In one embodiment, dual strained channel layers are
(Continued)

formed—a tensilely strained layer for NFET devices, and a compressively strained layer for PFET devices.

19 Claims, 12 Drawing Sheets

(51) Int. Cl.
    *H01L 29/06*     (2006.01)
    *H01L 29/66*     (2006.01)
    *H01L 21/8238*     (2006.01)
    *H01L 27/092*     (2006.01)

(52) U.S. Cl.
    CPC ...... *H01L 27/0924* (2013.01); *H01L 29/0649* (2013.01); *H01L 29/16* (2013.01); *H01L 29/66795* (2013.01); *H01L 29/7849* (2013.01)

(56) References Cited

U.S. PATENT DOCUMENTS

| | | | |
|---|---|---|---|
| 2008/0064197 A1 | 3/2008 | Zhu et al. | |
| 2008/0296615 A1 | 12/2008 | Savage et al. | |
| 2011/0147811 A1* | 6/2011 | Kavalieros | H01L 29/66795 257/288 |
| 2012/0074464 A1 | 3/2012 | Cea et al. | |
| 2012/0104472 A1* | 5/2012 | Xu | H01L 29/66795 257/288 |
| 2012/0168830 A1 | 7/2012 | Usuda et al. | |
| 2013/0193446 A1 | 8/2013 | Chao et al. | |
| 2014/0099774 A1 | 4/2014 | Vincent | |
| 2014/0175554 A1 | 6/2014 | Loubet et al. | |
| 2014/0339643 A1* | 11/2014 | Cheng | H01L 21/76224 257/369 |
| 2015/0255543 A1 | 9/2015 | Cheng et al. | |
| 2015/0263097 A1 | 9/2015 | Cheng et al. | |
| 2016/0064483 A1 | 3/2016 | Kelly et al. | |
| 2016/0163648 A1 | 6/2016 | Peter et al. | |
| 2016/0172462 A1 | 6/2016 | Cheng et al. | |
| 2016/0190303 A1 | 6/2016 | Liu et al. | |
| 2016/0276478 A1 | 9/2016 | Pawlak et al. | |
| 2016/0343734 A1 | 11/2016 | Doris et al. | |
| 2016/0372383 A1 | 12/2016 | Basker et al. | |
| 2017/0005169 A1 | 1/2017 | Loubet et al. | |

OTHER PUBLICATIONS

Liu, Q., et al., "High-Reliability, Low-Resistance Contacts for Nanoscale Transistors," U.S. Appl. No. 14/584,161, filed Dec. 29, 2014 (27 pgs.).

Loubet et al., "Co-Integration of Tensile Silicon and Compressive Silicon Germanium," U.S. Appl. No. 14/833,857, filed Aug. 24, 2015, 27 pages.

Loubet et al. "Self-Aligned SIGE FINFET" U.S. Appl. No. 15/365,640, filed Nov. 30, 2016 29 pages.

\* cited by examiner

SEMICONDUCTOR INTEGRATED STRUCTURE HAVING AN EPITAXIAL SIGE LAYER EXTENDING FROM SILICON-CONTAINING REGIONS FORMED BETWEEN SEGMENTS OF OXIDE REGIONS

BACKGROUND

Technical Field

The present disclosure generally relates to a strained channel FinFET device and, in particular, to a high-germanium concentration strained channel FinFET device built on a substrate having a strain-relaxed buffer layer (SRB).

Description of the Related Art

Advanced integrated circuits often feature strained channel transistors, silicon-on-insulator (SOI) substrates, FinFET structures, or combinations thereof, in order to continue scaling transistor gate lengths below 20 nm. Such technologies allow the channel length of the transistor to shrink while minimizing detrimental consequences such as current leakage and other short channel effects. A FinFET is an electronic switching device in which a conventional planar semiconducting channel is replaced by a semiconducting fin that extends outward from the substrate surface. In such a device, the gate, which controls current flow in the fin, wraps around three sides of the fin so as to influence current flow from three surfaces instead of one. The improved control achieved with a FinFET design results in faster switching performance and reduced current leakage than is possible with a planar transistor. FinFETs are described in further detail in U.S. Pat. No. 8,759,874, and U.S. Patent Application Publication US2014/0175554, assigned to the same assignee as the present patent application.

Strained silicon transistors have been developed to increase mobility of charge carriers, i.e., electrons or holes, passing through a semiconductor lattice. Incorporating strain into the channel of a semiconductor device stretches the crystal lattice, thereby increasing charge carrier mobility in the channel so that the device becomes a more responsive switch. Introducing a compressive strain into a PFET transistor tends to increase hole mobility in the channel, resulting in a faster switching response to changes in voltage applied to the transistor gate. Likewise, introducing a tensile strain into an NFET transistor tends to increase electron mobility in the channel, also resulting in a faster switching response.

There are many ways to introduce tensile or compressive strain into transistors, for both planar devices and FinFETs. In general, such techniques typically entail incorporating into the device epitaxial layers of one or more materials having crystal lattice dimensions or geometries that differ slightly from those of the silicon substrate. The epitaxial layers can be made of doped silicon or silicon germanium (SiGe), for example. Such epitaxial layers can be incorporated into source and drain regions, into the transistor gate that is used to modulate current flow in the channel, or into the channel itself, which is a portion of the fin. For example, one way to introduce strain is to replace bulk silicon from the source and drain regions, or from the channel, with silicon compounds such as silicon germanium (SiGe), for example. Because Si—Ge bonds are longer than Si—Si bonds, there is more open space in a SiGe lattice. The presence of germanium atoms having longer bonds stretches the lattice, causing internal strain. Electrons can move more freely through a lattice that contains elongated Si—Ge and Ge—Ge bonds, than through a lattice that contains shorter Si—Si bonds. Replacing silicon atoms with SiGe atoms can be accomplished during a controlled process of epitaxial crystal growth, in which a new SiGe crystal layer is grown from the surface of a bulk silicon crystal, while maintaining the same crystal structure of the underlying bulk silicon crystal. Alternatively, strain can be induced in the fin from below the device by using various types of silicon-on-insulator (SOI) substrates. An SOI substrate features a buried insulator, typically a buried oxide layer (BOX) underneath the active area. SOI FinFET devices have been disclosed in patent applications assigned to the present assignee, for example, U.S. patent application Ser. No. 14/231,466, entitled "SOI FinFET Transistor With Strained Channel," which is hereby incorporated by reference in its entirety.

Strain and mobility effects can be tuned by controlling the elemental composition within the epitaxially grown crystal. For example, it has been determined that epitaxial SiGe films containing a high concentration of germanium, e.g., in the range of 25%-40%, provide enhanced electron mobility compared with lower concentration SiGe films. Thus, from the point of view of device performance, it is generally advantageous to increase the percent concentration of germanium atoms in the fins in a FinFET. However, the lattice structures of high germanium concentration films tend to be mechanically unstable, especially if they contain a high number of dislocation type defects. It is understood that films having such a high germanium concentration can be stabilized if they are grown from a silicon substrate that includes a strain-relaxed buffer (SRB) layer. It is important, however, for the SRB layer to be free of defects to prevent defect propagation to the surface of the SRB layer, which can contaminate the active region where the FinFET is formed. Conventional SiGe SRB films are not defect free. Defects in the SRB layer can cause excessive current leakage, as well as device variability and poor reliability.

BRIEF SUMMARY

A modified silicon substrate having a substantially defect-free strain relaxed buffer layer of SiGe is suitable for use as a foundation on which to construct a high performance CMOS FinFET device. The substantially defect-free SiGe strain-relaxed buffer layer can be formed as a segmented, strained epitaxial film, in which edges of the film segments experience an elastic strain relaxation. When the segments are small enough, the overall film is relaxed so that the film is substantially without dislocation defects. Once the substantially defect-free strain-relaxed buffer layer is formed, strained channel layers can be grown epitaxially from the relaxed SRB layer. The strained channel layers are then patterned to create fins for a FinFET device. In one embodiment, dual strained channel layers are formed—a tensilely strained layer for NFET devices, and a compressively strained layer for PFET devices.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

DETAILED DESCRIPTION

Figure 1A:
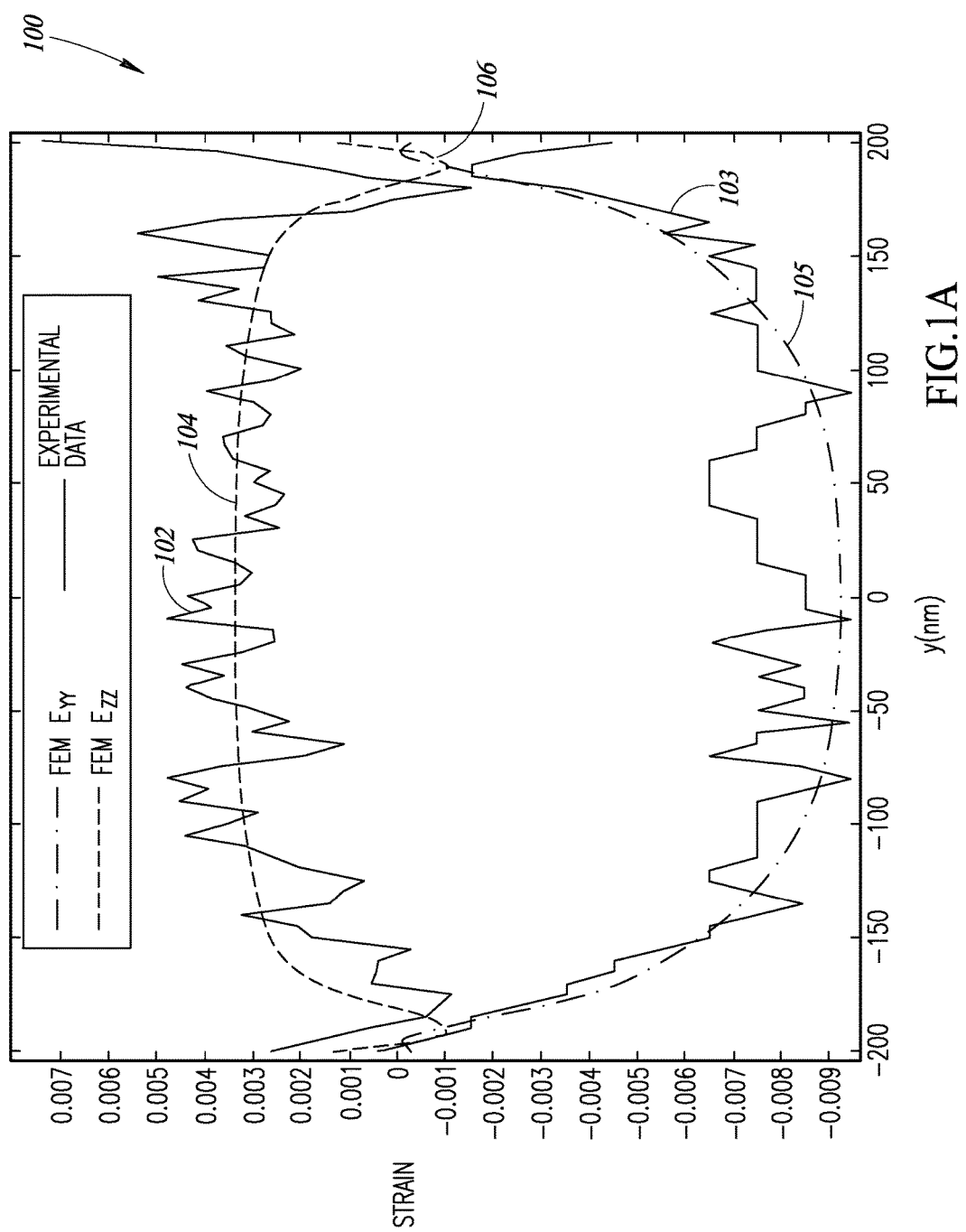
FIG. 1A is a plot comparing simulated and measured strain data as a function of position in a fin shown in FIG. 1B.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to strained FinFET devices that have been produced, however, the present disclosure and the reference to certain materials, dimensions, and the details and ordering of processing steps are exemplary and should not be limited to those shown.

Figure 1B:
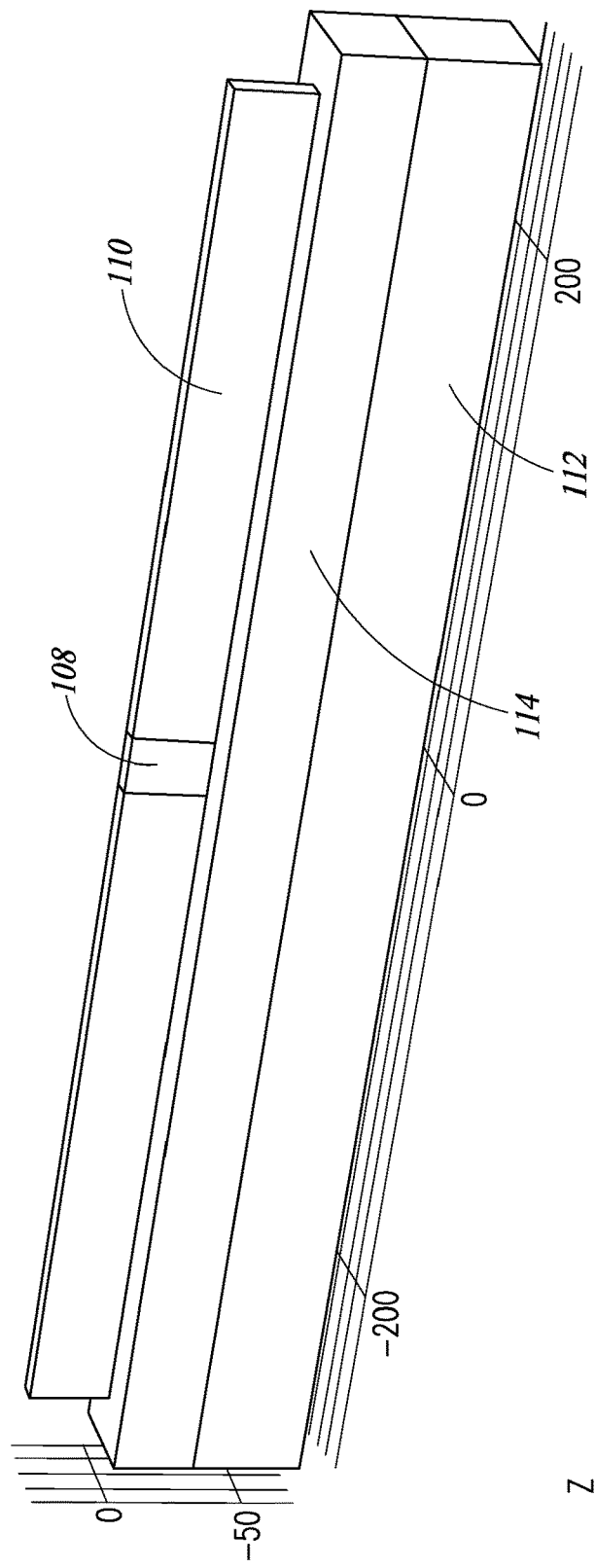
FIG. 1B is a perspective view of a fin formed from a substrate having a buried oxide (BOX) layer.

Turning now to the figures, FIG. 1A shows a plot 100 of strain in an exemplary SiGe fin 110 shown in FIG. 1B. The exemplary SiGe fin 110 is formed on a silicon substrate 112 that includes a buried oxide (BOX) layer 114. The strained SiGe fin 110 is formed from a SiGe layer that is epitaxially grown from the silicon substrate 112. The epitaxial SiGe layer constitutes an active region of the substrate above the BOX layer 114. The SiGe fin thus formed has substantially the same lattice parameters as a silicon lattice, even though germanium atoms are present in the lattice. It is understood that strain in the SiGe fin 110 originates from a difference in atomic bond lengths between Ge—Ge bonds and Si—Si bonds within the SiGe crystal lattice.

The plot 100 shows y- and z-components of strain as a function of distance along the y-axis of the SiGe fin 110, as indicated in FIG. 1B. The lower set of curves represents the y-component and the upper set of curves represents the z-component. The strain data extends +/−200 nm from either side of a midpoint of the SiGe fin 110, aligned with the origin of a reference axis as shown. Values of strain are highest at the midpoint of the fin, that is, at locations near y=0, compared with a substantially zero strain at the edges 106 of the SiGe fin 110, both for experimental data 102 and 103, and for simulated data 104 and 105, using a finite element method (FEM) analysis. The plot 100 thus shows that strain tends to be fully relaxed at the edges of the SiGe layer, and suggests that a series of cuts made in a SiGe layer will introduce a plurality of edges, effectively relaxing the entire SiGe fin 110. Wherever cuts are not made, for example, near the fin center, maximum strain is maintained. A strained channel 108 thus can be made to coincide with the central portion of the fin.

Figure 2:
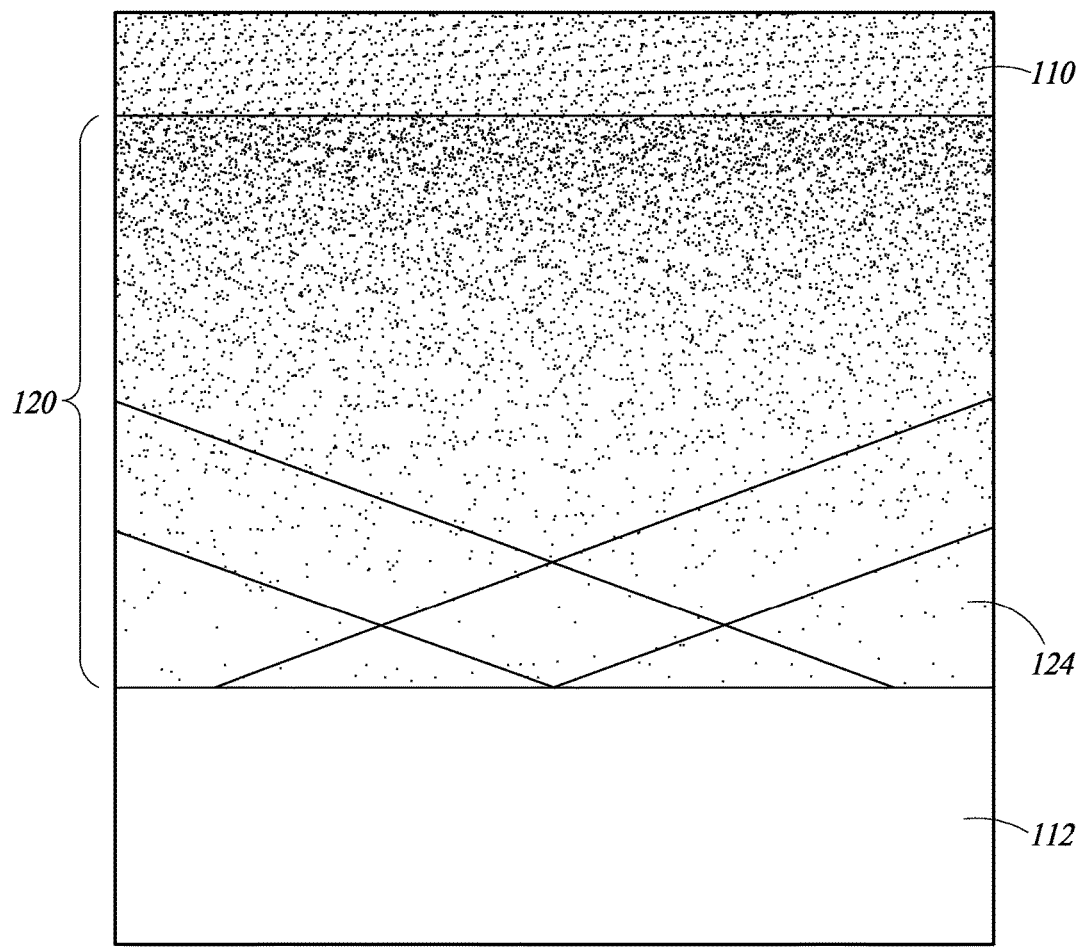
FIG. 2 is a schematic cross-sectional view of a conventional strain relaxed buffer (SRB) layer that includes a thick gradient SiGe layer, according to the prior art.

Insertion of a strain-relaxed buffer (SRB) layer 120 between the silicon substrate 112 and the active area of the SiGe fin 110 is a known technique that has been used to relax strain in the SiGe layer, thus permitting a higher concentration of germanium atoms to be introduced into the SiGe lattice. A conventional SRB layer 120 is shown in FIG. 2, according to the prior art. The conventional SRB layer 120 has a thickness in the range of about 1-5 μm and supports a germanium density gradient in which the concentration of germanium atoms is greater near the top, and smaller near the bottom of the SRB layer 120, wherein the germanium concentration varies within the range of about 25%-50% across the SRB layer. The conventional thick gradient SRB layer 120 includes dislocation defects having a density of about $10^5$ defects/cm$^2$ in the lower portion of the SRB layer 120. If the defects were to remain in a lower portion 124 of the SRB layer 120 where the density of germanium atoms is low, the active SiGe layer above the SRB layer might not be affected. However, such defects tend to propagate upward into the SiGe fin 110, where they can compromise the electrical response of the SiGe fin 110. Thus, it is desirable to form an alternative SRB layer that does not contain dislocation defects.

Figure 3:
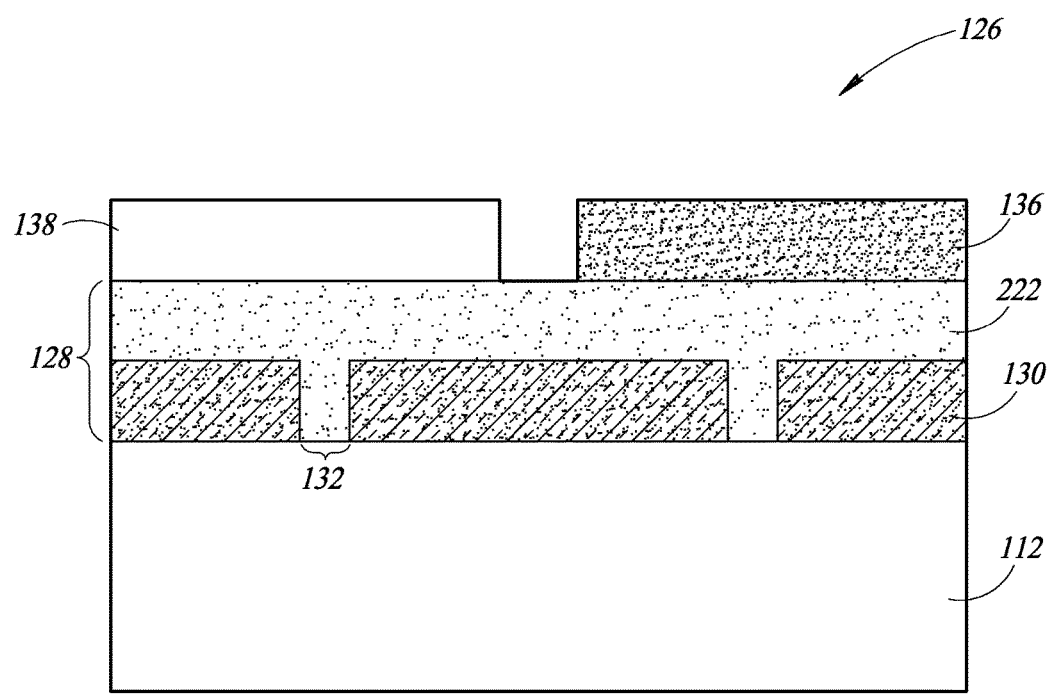
FIG. 3 is a cross-sectional view of dual strained epitaxial channel layers on a thin, substantially defect-free SRB, according to one embodiment described herein.

FIG. 3 shows a structure 126 that includes a substantially defect-free strained relaxed buffer (SRB) layer 128 formed on the silicon substrate 112, the SRB layer 128 supporting dual strained epitaxial channel layers 136 and 138 as described herein. The substantially defect-free SRB layer 128 includes an oxide layer 130 in which oxide segments are removed to form a plurality of cut-out regions 132 spaced apart from one another. The SRB layer 128 further includes a SiGe layer 134. The SiGe layer 134 is an epitaxial layer that is grown from strain-relaxed pillars 219 formed in the cut-out regions 132, as described below.

Figure 4:
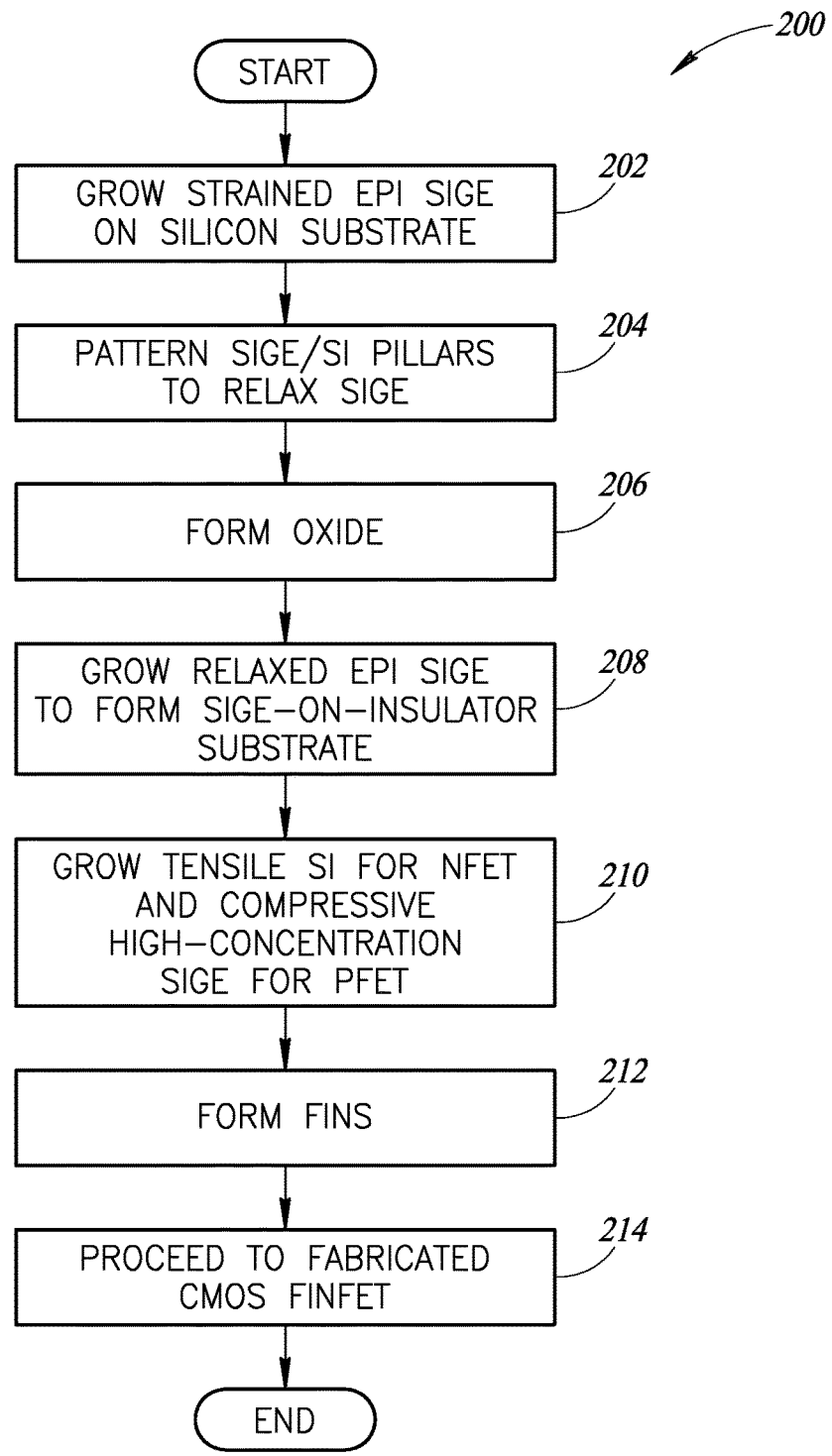
FIG. 4 is a flow diagram summarizing a sequence of processing steps that can be used to fabricate devices on a substantially defect-free SRB layer, according to one exemplary embodiment described herein.

FIG. 4 shows an exemplary sequence of steps in a method 200 of fabricating the structure 126, according to one embodiment. Steps 202-214 in the method 200 are illustrated in FIGS. 5A-7B and described below.

Figure 5A:
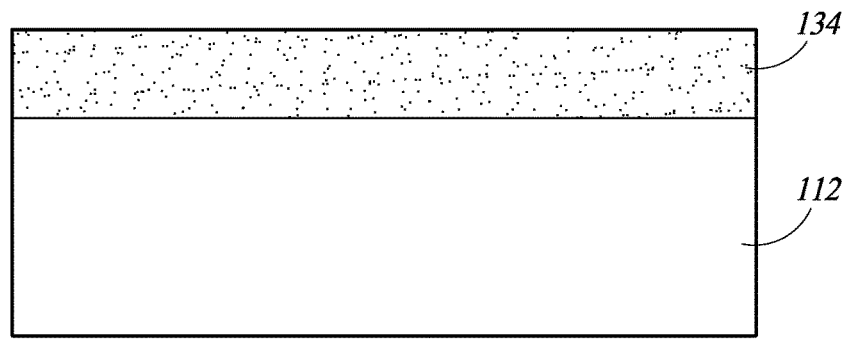
FIG. 5A is cross-sectional view of a SiGe layer on a silicon substrate prior to patterning strain-relaxed pillars, according to one embodiment described herein.

At 202, a first SiGe layer 134 is grown epitaxially from the silicon substrate 112, according to one embodiment shown in FIG. 5A. The first SiGe layer 134 is less than 100 nm thick and desirably has a germanium concentration of about 40%. The as-grown first SiGe layer 134 is fully strained by the lattice mismatch at the interface of the silicon crystal and the SiGe crystal, causing the SiGe layer 134 to be metastable.

Figure 5B:
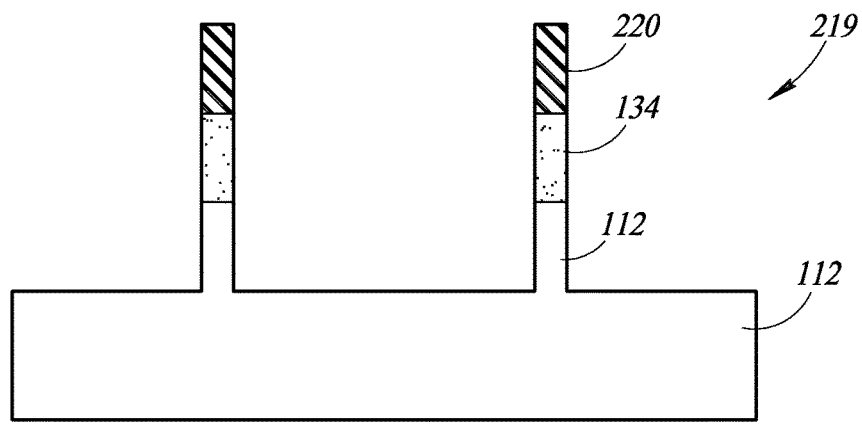
FIG. 5B is a cross-sectional view of a pair of Si/SiGe strain-relaxed pillars patterned using a silicon nitride (SiN) hard mask, according to one embodiment described herein.
Figure 5C:
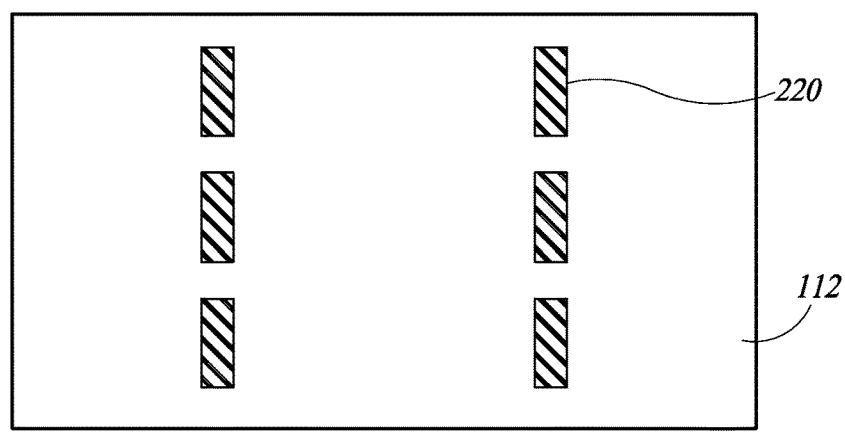
FIG. 5C is a top plan view of an array of six Si/SiGe strain-relaxed pillars such as those shown in FIG. 5B, according to one embodiment described herein.

At 204, the first SiGe layer 134 and a top portion of the silicon substrate 112 are patterned using a SiN hard mask 220 to form arrays of Si/SiGe strain-relaxed pillars 219, according to one embodiment shown in FIGS. 5B and 5C. This is carried out by etching away the portions of the layer 134 that are not covered by the SiN hard mask 220 using conventional etch techniques. In general, when the SiGe layer 134 is etched to create segments, during the etching part of the patterning process, strain is released. Thus, formation of the pillars 219 relaxes the SiGe layer 134. In one embodiment, each one of the Si/SiGe pillars 219 has a footprint measuring about 10×30 nm, for example, so that each Si/SiGe pillar 219 is small enough to be substantially relaxed due to multiple edge effects. The remaining segments are shown in FIG. 5C as a top plan view with the silicon nitride hard mask 220 visible as the topmost layer.

Figure 6A:
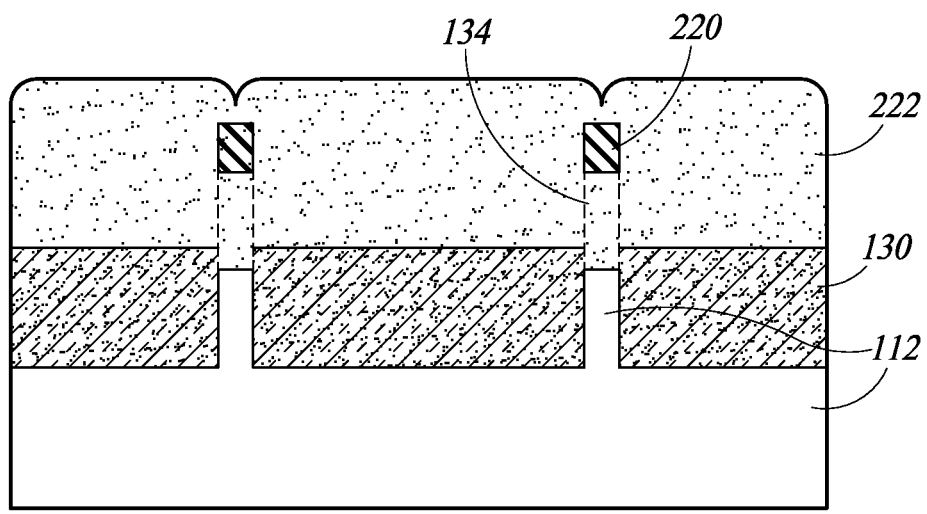
FIG. 6A is a cross-sectional view of the strain-relaxed pillars shown in FIG. 5B, following epitaxial growth of a SiGe layer from the strain-relaxed pillars, according to one embodiment described herein.
Figure 6B:
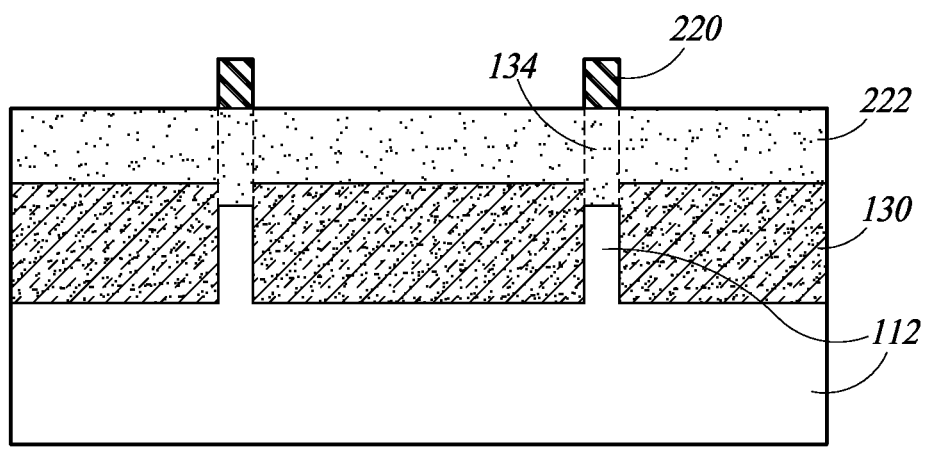
FIG. 6B is a cross-sectional view of a completed strain-relaxed buffer layer, according to one embodiment described herein.

At 206, the oxide layer 130 is formed according to one embodiment shown in FIGS. 6A and 6B. The oxide layer 130 is deposited, planarized, and recessed to a thickness within the range of about 30-140 nm, about 10 nm above the interface between the silicon substrate 112 and the first SiGe layer 134 in the strain-relaxed pillars 219.

At 208, a second, strain-relaxed SiGe layer 222 is epitaxially grown using sidewalls of the strain-relaxed Si/SiGe pillars 219 as seed layers to maintain the single crystal structure, according to one embodiment shown in FIG. 6A. The strain-relaxed SiGe layer 222 is grown to have a thickness that is less than 100 nm. In an embodiment, the germanium in the strain-relaxed SiGe layer 222 has a concentration in the range of about 25%-50%. The resulting structure is a SiGe-on-insulator substrate that has a low number of defects.

Figure 7A:
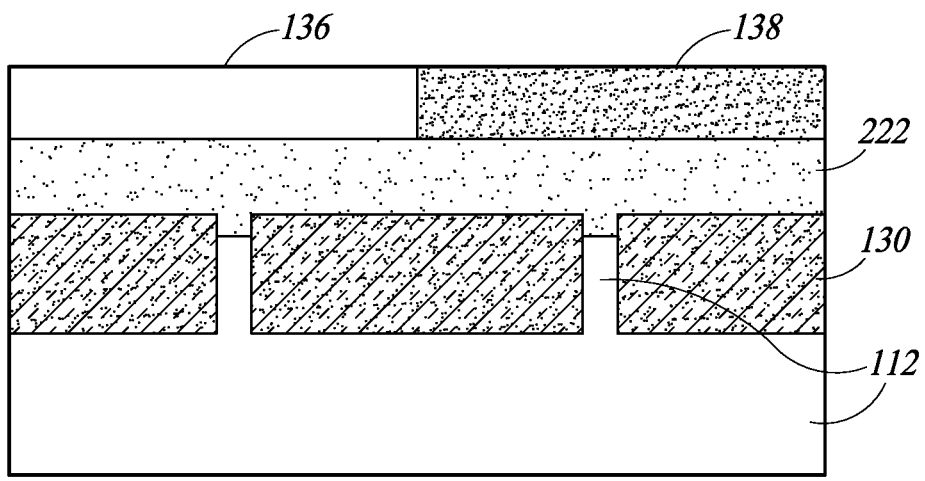
FIG. 7A is a cross-sectional view of dual strained epitaxial channel layers formed on top of the SRB layer, according to one embodiment described herein.

At 210, the strained channel layers 136 and 138 are formed according to one embodiment shown in FIG. 7A. First, the strain-relaxed SiGe layer 222 is planarized using the SiN hard mask 220 as a polish stop layer. The silicon nitride layer can then be removed by etching with an etch chemistry that is selective to silicon nitride. This will result in recesses in the strain-relaxed SiGe layer 222. Alternatively, the strain-relaxed SiGe layer 222 can be lowered first and then the silicon nitride can be etched to achieve the structure shown in FIG. 6B. In this embodiment an over-etch step lowers the surface of the strain-relaxed SiGe layer 222 to a level that substantially coincides with the bottom of the SiN hard mask 220. Next, the SiN hard mask 220 is stripped using, for example, a hot phosphoric acid dip, and polishing is resumed for a brief time to planarize the strain-relaxed SiGe layer 222. A first blocking mask is then patterned to block portions of the surface of the SiGe, while a tensilely strained silicon film is epitaxially grown from the strain-relaxed SiGe layer 222 to form the channel layer 136. The first blocking mask is then removed and a second blocking mask can be used to cover the channel layer 136 while a compressively-strained SiGe film is grown epitaxially from the strain-relaxed SiGe layer 222, to form the channel layer 138. The channel layers 136 and 138 each have a thickness in the range of about 50-100 nm. The channel layer 138 desirably has a high germanium concentration in the range of about 40%-55% germanium. In an embodiment, the channel layer 138 has a germanium concentration in the range of about 70%-90%.

Figure 7B:
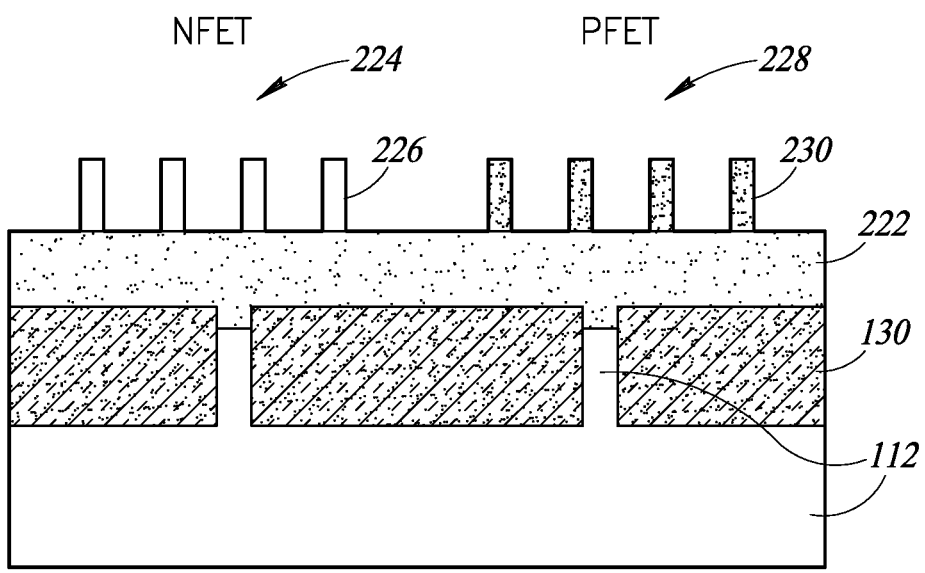
FIG. 7B is a cross-sectional view of tensilely strained silicon fins and compressively strained SiGe fins on a substantially defect-free SRB layer, according to one embodiment described herein.

At 212, fins 226 and 230 are formed over the SRB layer by patterning the channel layers 136 and 138, respectively, according to one embodiment shown in FIG. 7B. Patterning arrays 224, 228 of tensilely strained silicon n-type fins 226 and compressively strained SiGe p-type fins 230, each having pitches less than 14 nm, can be accomplished using a conventional SiN hard mask, or the process may use self-aligned sidewall image transfer (SIT) technique which is also well known in the art and therefore is not explained herein in detail. A description of an exemplary SIT process is found in U.S. Patent Application publication No. US2014/0175554.

At 214, CMOS processing is continued to complete formation of FinFETs from the n-type fins 226 and the p-type fins 230, according to one embodiment shown in FIGS. 8A-8D, using the PFET 228 as an example. Formation of FinFETs further includes formation of source and drain regions, and formation of a gate structure.

Figure 8A:
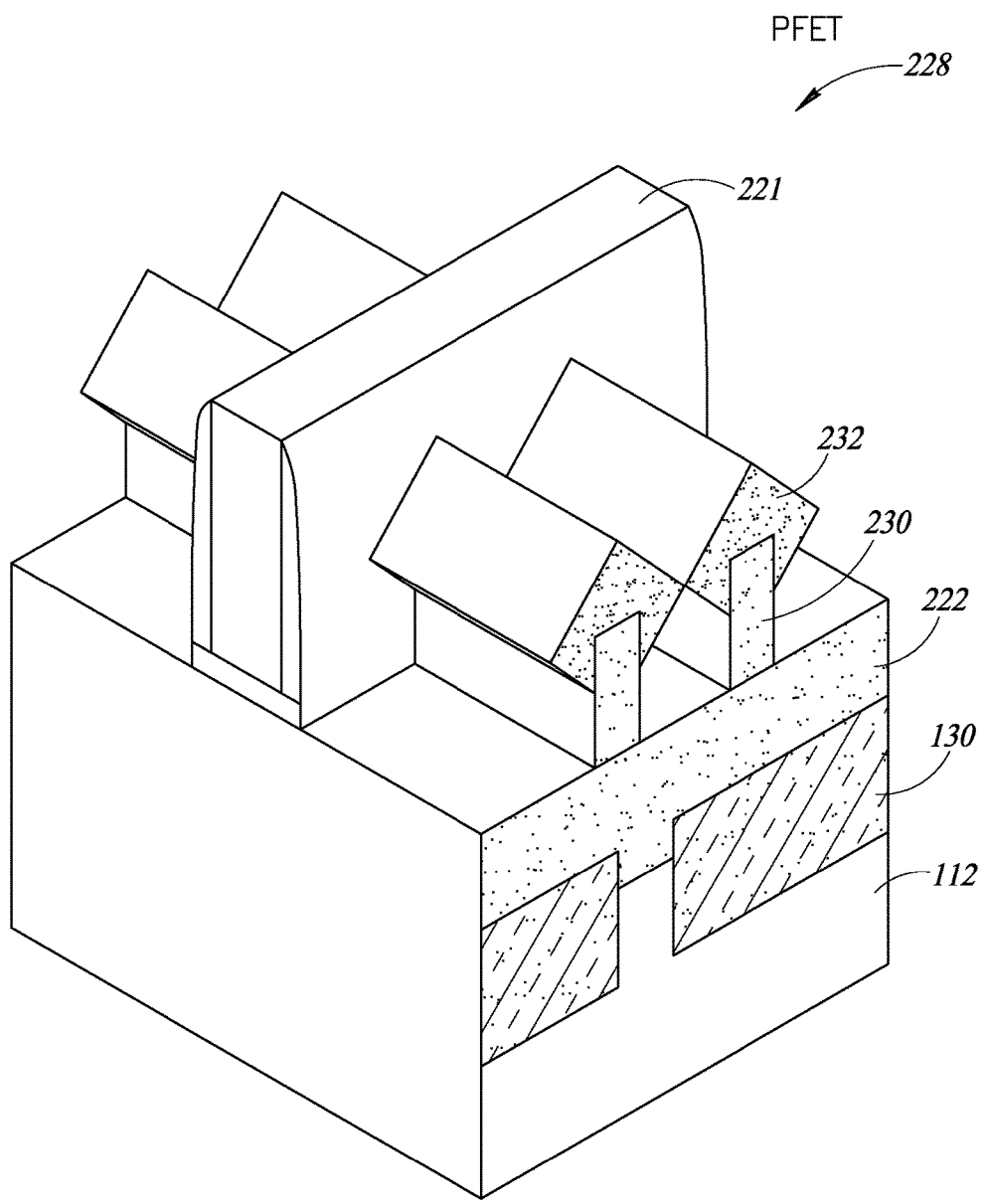
FIG. 8A is a perspective view of a FinFET structure formed on a substrate having a substantially defect-free SRB layer, as described herein.
Figure 8B:
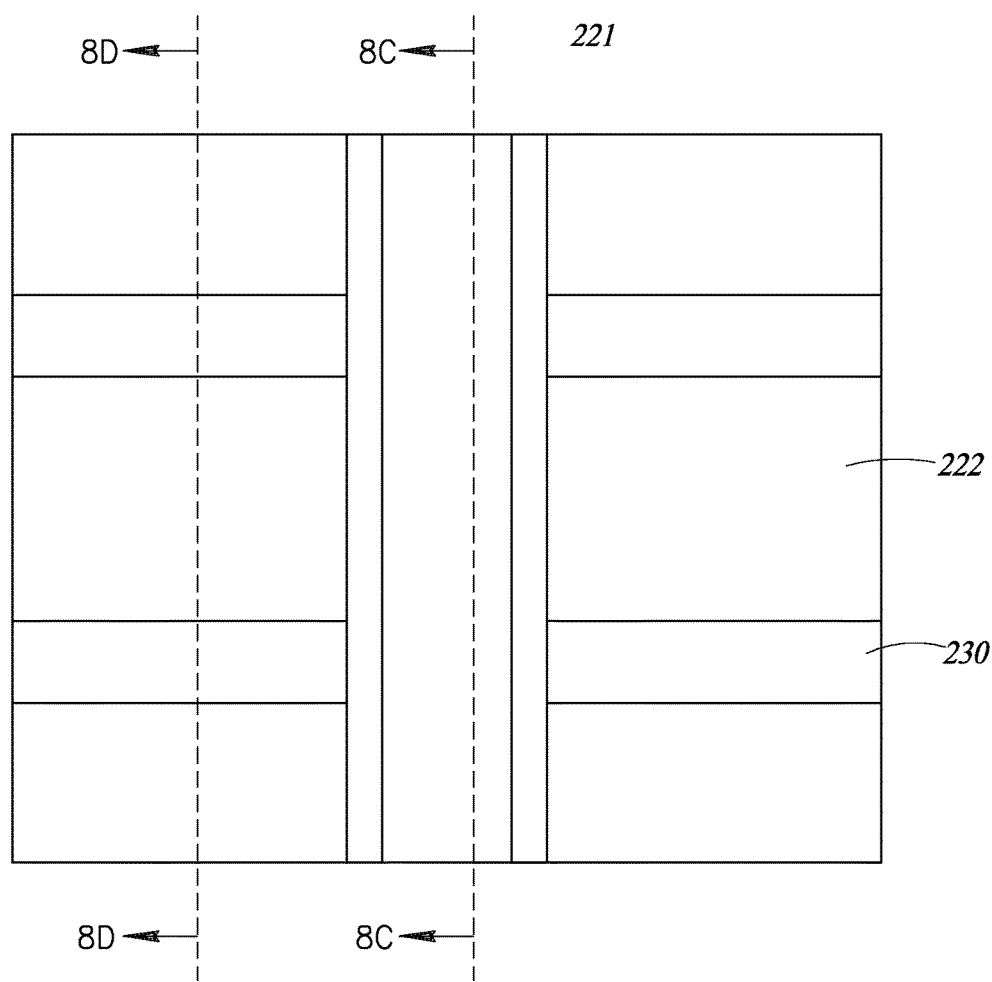
FIG. 8B is a top plan view of an exemplary layout of the FinFET structure shown in FIG. 8A.
Figure 8C:
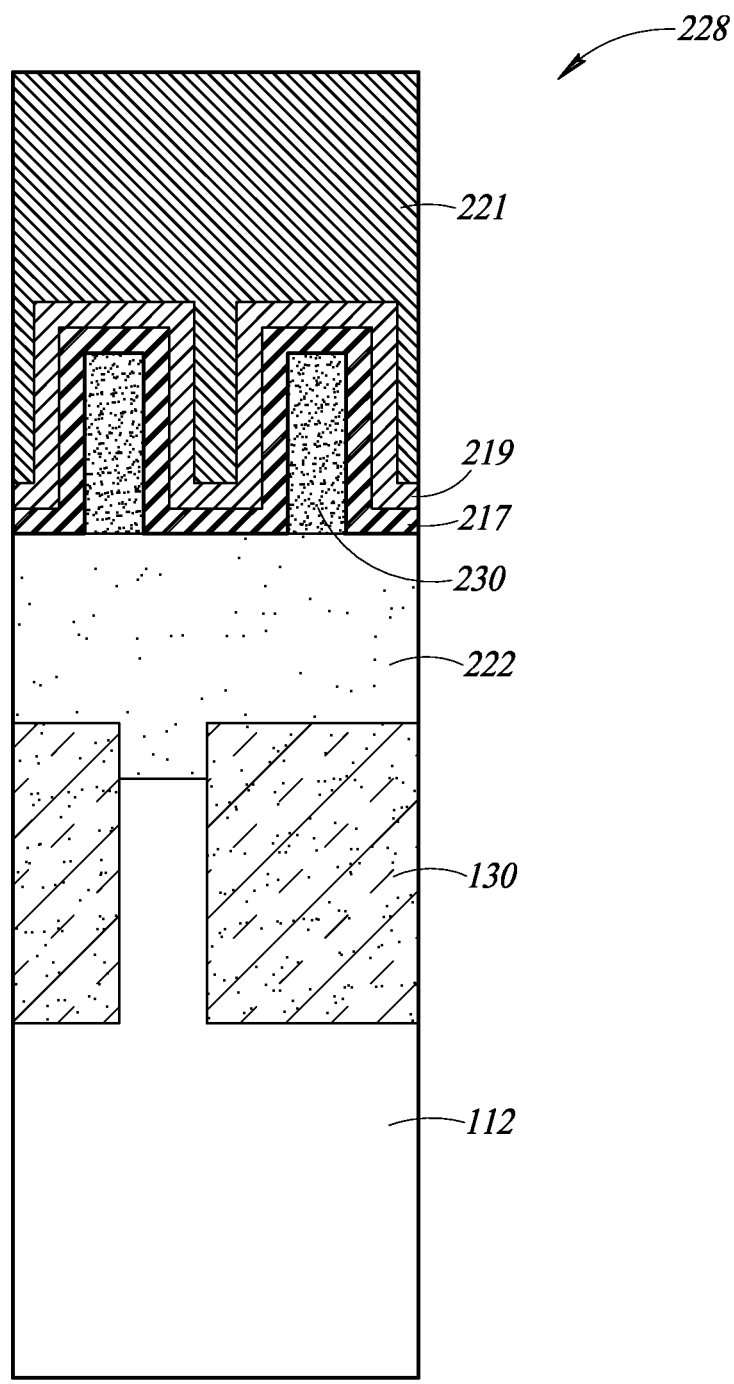
FIG. 8C is a cross-sectional view through two fins in the gate region of the FinFET structure shown in FIG. 8A.

In one embodiment, the gate structure for the PFET 228, shown in FIGS. 8A and 8C, includes a thin gate oxide 217 made of a high-k material such as $HfO_2$, and a metal gate electrode 221. The gate oxide 217 desirably has a thickness in the range of about 3-5 nm. In one embodiment, the metal gate electrode 221 is made of different materials for the NFET and PFET devices. Either the PFET, the NFET, or both may also include an additional gate stack layer made of a work function metal to create additional strain, or to tune the amount of strain in the channel region. Alternatively, a replacement metal gate (RMG) process can be used, as is known in the art. In the RMG process, a temporary gate structure, typically made of polysilicon, is formed first, and is later replaced after formation of the source and drain regions, by a metal gate structure. The gate structure 228 contacts three surfaces of the fin 226, for an NFET device, or the fin 230 for a PFET device. FIG. 8C shows an exemplary metal gate structure that includes a high-k gate dielectric 217, e.g., $HfO_2$, and a metal gate 223 made of, for example, tungsten, for the PFET device. The gate structure for the PFET device 228 may include the same metal gate material or a different metal gate material 221, and additionally may include a work function metal layer 219, made of, for example, TiN. Details of an exemplary process for completing a strained FinFET device are described in U.S. patent application Ser. No. 14/231,466, which is assigned to the same assignee as the present patent application, and hereby incorporated by reference in its entirety.

Figure 8D:
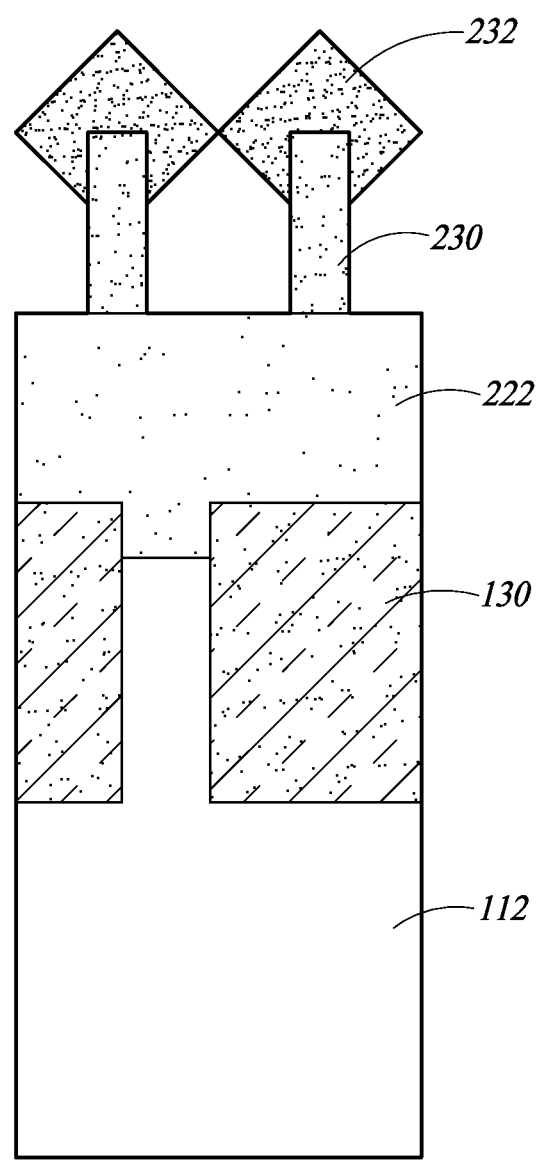
FIG. 8D is a cross-sectional view through the source/drain region of the FinFET structure shown in FIG. 8A.

Source and drain regions, shown in FIG. 8D, can be formed from, or adjacent to, portions of the fins 226 and 230 outside the gate structure 228, to serve as charge reservoirs for the FinFET. In one embodiment, raised source and drain regions can be formed as epitaxial extensions 232 grown outward from the strained fins 230. The epitaxial extensions 232 in the example shown have diamond-shaped profiles, and they are merged, meaning that the epitaxial extensions 232 touch one another. However, in general, the profiles can have a variety of shapes, and depending on their application, the epitaxial extensions 232 may be merged or un-merged, i.e., separated from one another. Epitaxial source/drain extensions are shown and discussed in further detail in U.S. patent application Ser. No. 14/584,161.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

The invention claimed is:

1. A semiconductor integrated structure comprising:
   a silicon base;
   a strain-relaxed buffer layer overlying the silicon base, the strain-relaxed buffer layer including:
      an oxide layer in which a plurality of oxide segments form regions spaced apart from one another,
      silicon-containing regions positioned between the segments of the oxide regions, and
      a SiGe layer overlying the oxide layer, the SiGe layer having a surface, portions of the SiGe layer extending between the segments of the oxide regions and abutting the silicon-containing regions, the SiGe layer having a first germanium concentration; and
   an array of SiGe fins on the surface of the SiGe layer, the surface of the SiGe layer extending between adjacent ones of the SiGe fins, the SiGe fins having a second germanium concentration that is greater than the first germanium concentration, each of the SiGe fins including a source region, a drain region, and a channel region between the source and drain regions, each of the source region, the drain region, and the channel region being on a surface of the SiGe layer.

2. The semiconductor integrated structure of claim 1, further comprising an array of tensilely-strained silicon fins on the SiGe layer.

3. The semiconductor integrated structure of claim 1 wherein the second germanium concentration in the SiGe fins is within a range of about 70%-90%.

4. The semiconductor integrated structure of claim 1 wherein the first germanium concentration in the SiGe layer is within a range of about 25-50%.

5. The semiconductor integrated structure of claim 1 wherein the strain-relaxed buffer layer is substantially free of dislocation defects.

6. The semiconductor integrated structure of claim 1 wherein each of the SiGe fins has a substantially uniform height from the surface of the SiGe layer.

7. A device, comprising:
   a semiconductor base of a first semiconductor material;
   a plurality of oxide segments on the semiconductor base, the plurality of oxide segments being separated from one another by respective portions of the semiconductor base;
   a semiconductor layer of a second semiconductor material overlying the oxide segments and extending between respective pairs of the oxide segments, the semiconductor layer having a surface;

a first array of fins of the first semiconductor material formed on, and in abutting contact with, the surface of the semiconductor layer, the surface of the semiconductor layer extending between adjacent ones of the first array of fins; and a second array of fins of the second semiconductor material, each of the fins of the second array of fins including a source region, a drain region, and a channel region formed on, and in abutting contact with, the surface of the semiconductor layer, the surface of the semiconductor layer extending between adjacent ones of the second array of fins, the second semiconductor material being different than the first semiconductor material.

8. The device of claim 7 wherein the semiconductor layer abuts the respective portions of the semiconductor base between respective oxide segments.

9. The device of claim 7 wherein the first semiconductor material includes silicon.

10. The device of claim 9 wherein the second semiconductor material includes silicon germanium.

11. The device of claim 7 wherein the first array of fins are tensilely-strained.

12. The device of claim 11 wherein the first array of fins are formed of silicon.

13. The device of claim 7 wherein the second array of fins are compressively-strained.

14. The device of claim 13 wherein the second array of fins are formed of silicon germanium.

15. A semiconductor integrated structure comprising:

a semiconductor base of a first semiconductor material;

a strain-relaxed buffer layer overlying the semiconductor base, the strain-relaxed buffer layer including:

an oxide layer including a plurality of oxide segments spaced apart from one another, portions of the semiconductor base extending between the oxide segments, and a semiconductor layer of a second semiconductor material overlying the oxide layer, portions of the semiconductor layer extending between the oxide segments and abutting respective portions of the semiconductor base, the semiconductor layer having a surface;

a first array of tensilely-strained fins of the first semiconductor material overlying and in abutting contact with the surface of the semiconductor layer, the surface of the semiconductor layer extending between adjacent ones of the first array of fins; and a second array of compressively-strained fins of the second semiconductor material, each of the fins of the second array including a source region, a drain region, and a channel region overlying and in abutting contact with the surface of the semiconductor layer, the surface of the semiconductor layer extending between adjacent ones of the second array of fins, the second semiconductor material being different than the first semiconductor material.

16. The semiconductor integrated structure of claim 15 wherein the first semiconductor material comprises silicon.

17. The semiconductor integrated structure of claim 16 wherein the second semiconductor material comprises silicon germanium.

18. The semiconductor integrated structure of claim 17 wherein a concentration of germanium in the semiconductor layer is in the range of about 25-50%.

19. The semiconductor integrated structure of claim 15 wherein the strain-relaxed buffer layer is substantially free of dislocation defects.

* * * * *